US011080438B2

(12) United States Patent
Gao et al.

(10) Patent No.: US 11,080,438 B2
(45) Date of Patent: Aug. 3, 2021

(54) BUILDING-INFORMATION MANAGEMENT SYSTEM WITH DIRECTIONAL WIND PROPAGATION AND DIFFUSION

(71) Applicant: International Business Machines Corporation, Armonk, NY (US)

(72) Inventors: Yun He Gao, Xi'an (CN); Yang Zhang, Xi'an (CN)

(73) Assignee: International Business Machines Corporation, Armonk, NY (US)

(*) Notice: Subject to any disclaimer, the term of this patent is extended or adjusted under 35 U.S.C. 154(b) by 393 days.

(21) Appl. No.: 15/992,285

(22) Filed: May 30, 2018

(65) Prior Publication Data

US 2019/0370416 A1  Dec. 5, 2019

(51) Int. Cl.
*G06F 30/13* (2020.01)
*G06N 5/04* (2006.01)
*G06N 20/00* (2019.01)

(52) U.S. Cl.
CPC .............. *G06F 30/13* (2020.01); *G06N 5/04* (2013.01); *G06N 20/00* (2019.01)

(58) Field of Classification Search
CPC ........... G06F 30/13; G06N 20/00; G06N 5/04
(Continued)

(56) References Cited

U.S. PATENT DOCUMENTS 6,487,457 B1 * 11/2002 Hull ..................... G05B 15/02
  700/17
7,218,011 B2 * 5/2007 Hiel ..................... F03D 80/70
  290/43

(Continued)

FOREIGN PATENT DOCUMENTS

CN  103499518    1/2014
CN  103544387 A  1/2014
(Continued)

OTHER PUBLICATIONS

Lien et al. ("Numerical Modelling of the Turbulent Flow Developing Within and Over a 3-D Building Array, Part I: a High-Resolution Reynolds-Averaged Navier-Stokes Approach", Kluwer Academic Publishers, 2004, pp. 427-466) (Year: 2004).*

Razak et al. ("Analysis of airflow over building arrays for assessment of urban wind Environment", Elsevier Ltd., 2013, pp. 56-65) (Year: 2013).*

(Continued)

*Primary Examiner* — Iftekhar A Khan
(74) *Attorney, Agent, or Firm* — Schmeiser, Olsen & Watts; Nicholas L. Cadmus

(57) ABSTRACT

A building-information management (BIM) system receives a set of wind vectors that identify wind speeds and directions at the surfaces of physical structures within a volume of air. The system stratifies the volume into vertically stacked layers that each contains similar wind vectors. Each layer is then divided horizontally into rectangular cells that each at least partially encloses a cluster of the structures. The system infers cell-specific relationships that relate physical attributes of the enclosed structures with the cell's incoming and outgoing airflows, from which the system builds a wind-propagation model for each cell. These cell-specific models are combined into a regional wind-propagation model that predicts how winds entering the volume will be propagated as outgoing wind vectors. The regional model is used by downstream modules of the BIM system to account for airflow effects when designing a planned building.

17 Claims, 7 Drawing Sheets

(58) Field of Classification Search
USPC .......................................................... 703/1
See application file for complete search history.

(56) References Cited

U.S. PATENT DOCUMENTS

| | | | | |
|---|---|---|---|---|
| 10,169,486 | B2* | 1/2019 | Park | G05D 23/1931 |
| 2007/0261062 | A1* | 11/2007 | Bansal | G05B 23/0264 |
| | | | | 719/318 |
| 2011/0316279 | A1* | 12/2011 | Bahari | F03D 9/34 |
| | | | | 290/44 |
| 2012/0031200 | A1* | 2/2012 | Ito | G01N 15/0606 |
| | | | | 73/861.42 |
| 2012/0050750 | A1* | 3/2012 | Hays | G01S 17/003 |
| | | | | 356/519 |
| 2012/0143565 | A1* | 6/2012 | Graham, III | G05B 23/0237 |
| | | | | 702/181 |
| 2012/0169053 | A1* | 7/2012 | Tchoryk, Jr. | G01P 5/26 |
| | | | | 290/44 |
| 2013/0110558 | A1* | 5/2013 | Maher | G06Q 40/08 |
| | | | | 705/4 |
| 2013/0189102 | A1* | 7/2013 | Wedel-Heinen | F03D 7/0288 |
| | | | | 416/42 |
| 2013/0314694 | A1* | 11/2013 | Tchoryk, Jr. | G01N 21/538 |
| | | | | 356/28.5 |
| 2014/0039843 | A1* | 2/2014 | Hazra | G06F 30/20 |
| | | | | 703/1 |
| 2014/0046510 | A1* | 2/2014 | Randolph | G01P 13/045 |
| | | | | 701/14 |
| 2014/0325922 | A1* | 11/2014 | Bowers | E04H 9/02 |
| | | | | 52/167.2 |
| 2014/0351337 | A1* | 11/2014 | Pal | H04W 4/08 |
| | | | | 709/204 |
| 2015/0145253 | A1* | 5/2015 | Bayon | F03D 9/25 |
| | | | | 290/44 |
| 2016/0033946 | A1* | 2/2016 | Zhu | G05B 15/02 |
| | | | | 700/275 |
| 2016/0140260 | A1* | 5/2016 | Skiba | G06F 30/20 |
| | | | | 703/1 |
| 2016/0313752 | A1* | 10/2016 | Przybylski | G05B 15/02 |
| 2017/0050656 | A1* | 2/2017 | Dasaratha | G06N 20/00 |
| 2017/0233051 | A1* | 8/2017 | Kawasaki | B63H 25/04 |
| | | | | 701/21 |
| 2017/0262552 | A1* | 9/2017 | Noma | G06N 20/00 |
| 2017/0315697 | A1* | 11/2017 | Jacobson | H04L 12/2816 |
| 2018/0017039 | A1* | 1/2018 | Davoust | G01S 17/95 |
| 2018/0246138 | A1* | 8/2018 | Holtom | G01S 13/956 |
| 2019/0024781 | A1* | 1/2019 | Chrungoo | G08G 1/162 |
| 2019/0158309 | A1* | 5/2019 | Park | H04L 12/2832 |
| 2019/0188584 | A1* | 6/2019 | Rao | G06Q 10/00 |
| 2019/0285662 | A1* | 9/2019 | Duncan | G01S 17/58 |

FOREIGN PATENT DOCUMENTS

| | | |
|---|---|---|
| CN | 205749558 | 11/2016 |
| CN | 104732038 B | 5/2018 |
| WO | WO2014028519 | 2/2014 |

OTHER PUBLICATIONS

Chen et al. ("Density-Based Clustering for Real-Time Stream Data", ACM, 2007, pp. 133-142 (Year: 2007).*
Zaki et al. ("Aerodynamic Parameters of Urban Building Arrays with Random Geometries", Boundary-Layer Meteorol (2011) 138:99-120). (Year: 2011).*
Baskaran et al. ("Prediction of Wind Effects on Buildings Using Computational Methods Review of the State of the Art", Canadian Conference or1 Computing in Civil Engineering, 1994, pp. 805-822) (Year: 1994).*
Salim et al., Including Trees in the Numerical Simulations of the Wind Flow in Urban Areas: Should We Care?, Source: Journal of Wind Engineering and Industrial Aerodynamics, vol. 144, Sep. 2015, pp. 84-95.
Summers et al., a Random Vortex Simulation of Wind-Flow Over a Building, Retrieved from Internet: URL: http://onlinelibrary.wiley.com/doi/10.1002/fld.1650051002/full, First Published Oct. 1985, 2 pages.
R.N. Meroney, Professor, Wind Tunnel and Numerical Simulation of Pollution Dispersion: a Hybrid Approach, Retrieved from Internet: URL: http://www.engr.colostate.edu/~meroney/PapersPDF/CEP04-05-2.pdf, Source: Civil Engineering, Wind Engineering and Fluids Laboratory, Colorado State University, Fort Collins, CO USA 80523, Dec. 6-10, 2004, 60 pages.
Moreira, Davidson M. et al.; Plume dispersion simulation in low wind conditions in stable and convective boundary ayers; Atmospheric Environment; vol. 39, Issue 20, Jun. 2005, pp. 3643-3650.

* cited by examiner

```
                    │
                    ▼
    ┌─────────────────────────────────────────┐
    │ Repeat for each stratified horizontal layer of volume │── 600
    └─────────────────────────────────────────┘
                    │
                    ▼
    ┌─────────────────────────────────────────┐
    │ Repeat for each cell of current stratified layer │── 610
    └─────────────────────────────────────────┘
                    │
                    ▼
    ┌─────────────────────────────────────────┐
    │ Retrieve cell attributes from Attributes Database │── 620
    └─────────────────────────────────────────┘
                    │
                    ▼
    ┌─────────────────────────────────────────┐
    │ Derive empirical directional wind-speed decay rates │── 630
    └─────────────────────────────────────────┘
                    │
                    ▼
    ┌─────────────────────────────────────────┐
    │        Infer relationships between        │── 640
    │  wind-speed decay rates & cell attributes │
    └─────────────────────────────────────────┘
                    │
                    ▼
    ┌─────────────────────────────────────────┐
    │ Infer association rules based on relationships between │── 650
    │   wind-direction characteristics & cell attributes     │
    └─────────────────────────────────────────┘
                    │
                    ▼
    ┌─────────────────────────────────────────┐
    │ Simulate wind-propagation properties for entire layer │── 660
    └─────────────────────────────────────────┘
                    │
                    ▼
```

FIG. 6

BUILDING-INFORMATION MANAGEMENT SYSTEM WITH DIRECTIONAL WIND PROPAGATION AND DIFFUSION

BACKGROUND

The present invention relates generally to urban planning and to other fields that incorporate principles of architectural design, and relates specifically to improving BIM (Building-information management) architectural-design systems to intelligently account for external and internal air flows during the design of one or more buildings.

Unlike older two-dimensional blueprint-based architectural-design methodologies and three-dimensional computerized CAD systems, BIM applications may augment the three spatial dimensions of a 3D building plan with time as a fourth dimension (a 4D plan) or cost as a fifth dimension (a 5D plan). BIM applications, for example, may account for spatial relationships, light analysis, geographic information, budgeting constraints, materials costs, voids and air spaces between physical objects, and component specifications. Therefore, instead of merely providing a two-dimensional drawing or three-dimensional physical model of buildings, BIM technology creates intelligent "virtual information models" that may be used by architects, surveyors, civil engineers, urban planners, and other architectural professionals to direct the activities of general contractors and construction specialists.

One drawback of current BIM systems is an inability to account for internal and external airflows when designing physical structures. When determining the location and physical properties of a building, it is important to account for the magnitudes and directions of such external air flows, such as the horizontal and vertical velocity and directional characteristics of environmental air movement. Such considerations may be necessary, for example, in order to effectively design and distribute a building's air ducts and internal ventilation systems, and to optimize the building's physical effects on its environment, such as the building's effect on the natural dispersal of environmental pollutants or the building's effect on channeling wind vectors throughout the immediate neighborhood.

Current BIM systems do not effectively account for such factors. Known methods may at best roughly approximate air flow parameters as a function of non-directional particle diffusion, which do not predict, analyze, or simulate directional diffusion characteristics, such as horizontal and vertical wind-speed vectors. Furthermore, because the minimal airflow-analysis functionality of known automated building-design systems use principles of aerodynamics and basic geometry to analyze and model air flows, these known systems require complex, resource-intensive procedures in order to derive even relatively simple approximations.

SUMMARY

An embodiment of the present invention is a building-information management system comprising a processor, a memory coupled to the processor, and a computer-readable hardware storage device coupled to the processor, the storage device containing program code configured to be run by the processor via the memory to implement a method for a building-information management system with directional wind propagation and diffusion, the method comprising:

the processor receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;

the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;

the processor retrieving a set of building attributes that identify locations and physical dimensions of buildings located within the volume of space;

the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;

the processor selecting, as a function of those received wind vectors that were measured at measurement points comprised by the first cell, an input wind speed of the first cell in each horizontal wind direction and an output wind speed of the first cell in each horizontal wind direction, where each horizontal wind direction is selected from the group consisting of northerly, southerly, easterly, and westerly;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

Another embodiment of the present invention is a method for a building-information management system with directional wind propagation and diffusion, the method comprising:

a processor of the building-information management system receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;

the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;

the processor retrieving a set of building attributes that identify locations and physical dimensions of buildings located within the volume of space;

the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;

the processor selecting, as a function of those received wind vectors that were measured at measurement points comprised by the first cell, an input wind speed of the first cell in each horizontal wind direction and an output wind speed of the first cell in each horizontal wind direction, where each horizontal wind direction is selected from the group consisting of northerly, southerly, easterly, and westerly;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

Yet another embodiment of the present invention is a computer program product, comprising a computer-readable hardware storage device having a computer-readable program code stored therein, the program code configured to be executed by a building-information management system comprising a processor, a memory coupled to the processor, and a computer-readable hardware storage device coupled to the processor, the storage device containing program code configured to be run by the processor via the memory to implement a method for a building-information management system with directional wind propagation and diffusion, the method comprising:

the processor receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;

the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;

the processor retrieving a set of building attributes that identify locations and physical dimensions of buildings located within the volume of space;

the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;

the processor selecting, as a function of those received wind vectors that were measured at measurement points comprised by the first cell, an input wind speed of the first cell in each horizontal wind direction and an output wind speed of the first cell in each horizontal wind direction, where each horizontal wind direction is selected from the group consisting of northerly, southerly, easterly, and westerly;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

BRIEF DESCRIPTION OF THE DRAWINGS

FIG. 6 is a flow chart that illustrates steps for generating propagation and diffusion values for cells and layers of a previously generated horizontal layer in accordance with embodiments of the present invention.

DETAILED DESCRIPTION

The present invention comprises systems, methods, and computer program products for improving current automated BIM systems with the ability to simulate and derive directional characteristics of external airflows, such as the speed, direction, propagation and decay rates, and diffusion characteristics of wind currents. Systems 200 that comprise such improved BIM technologies can then use this information, when generating 4D or 5D models 240 of planned buildings, infrastructure, or neighborhoods within a three-dimensional volume of space, in order to better account for interactions between the external airflows and the planned buildings or infrastructure.

The present invention further improves known BIM systems by allowing such systems to quantify complex directional diffusion parameters at low, near-ground altitudes, and to represent wind speeds, wind directions, and geographical information as vector indices. These improvements also allow an airflow-analysis module 210 of the improved BIM system 200 to account for airflow, diffusion, and ventilation characteristics of specific classes of geographical environment, such as grasslands, lakes, or building-dense urban neighborhoods.

The present invention performs these tasks by using properties of wind speed and direction measurements sampled concurrently throughout the three-dimensional volume of space to vertically stratify the volume into layers, and to then subdivide each layer into a layer-specific grid of cells.

Figure 3:
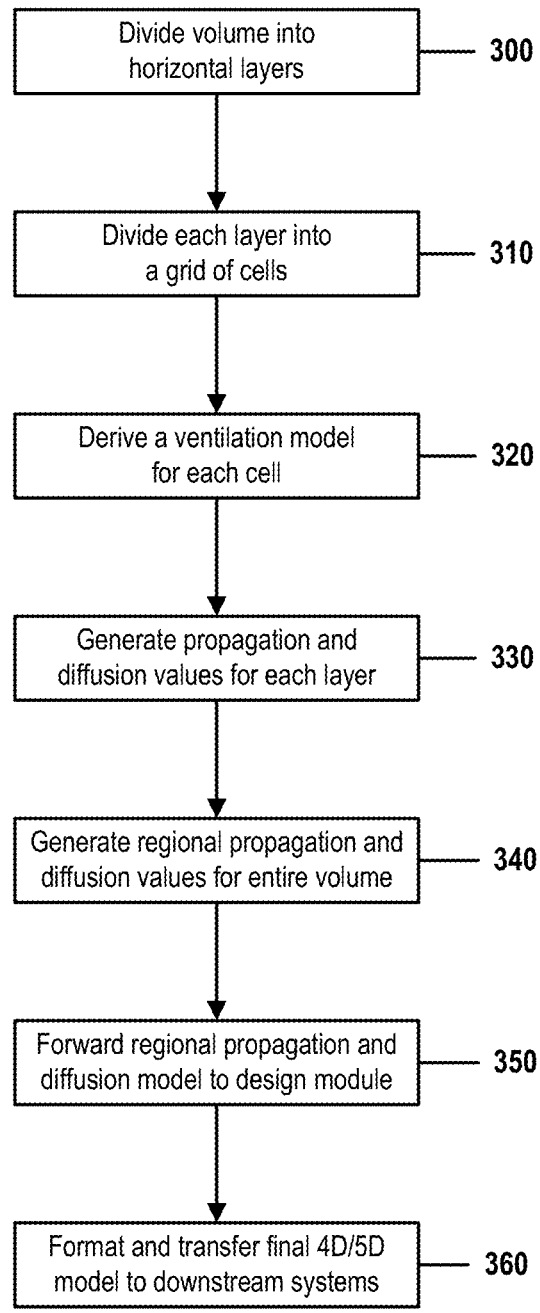
FIG. 3 is a flow chart that illustrates steps of a method for building-information management system with directional wind propagation and diffusion in accordance with embodiments of the present invention.

These tasks, performed by means of the four-stage procedure shown in FIG. 3 and elaborated in subsequent figures, improves known BIM technology by solving a previously unsolved technical problem in a manner that is not well-understood, routine, or conventional in the fields of building-information management, architectural design, civil engineering, HVAC design, or related fields.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
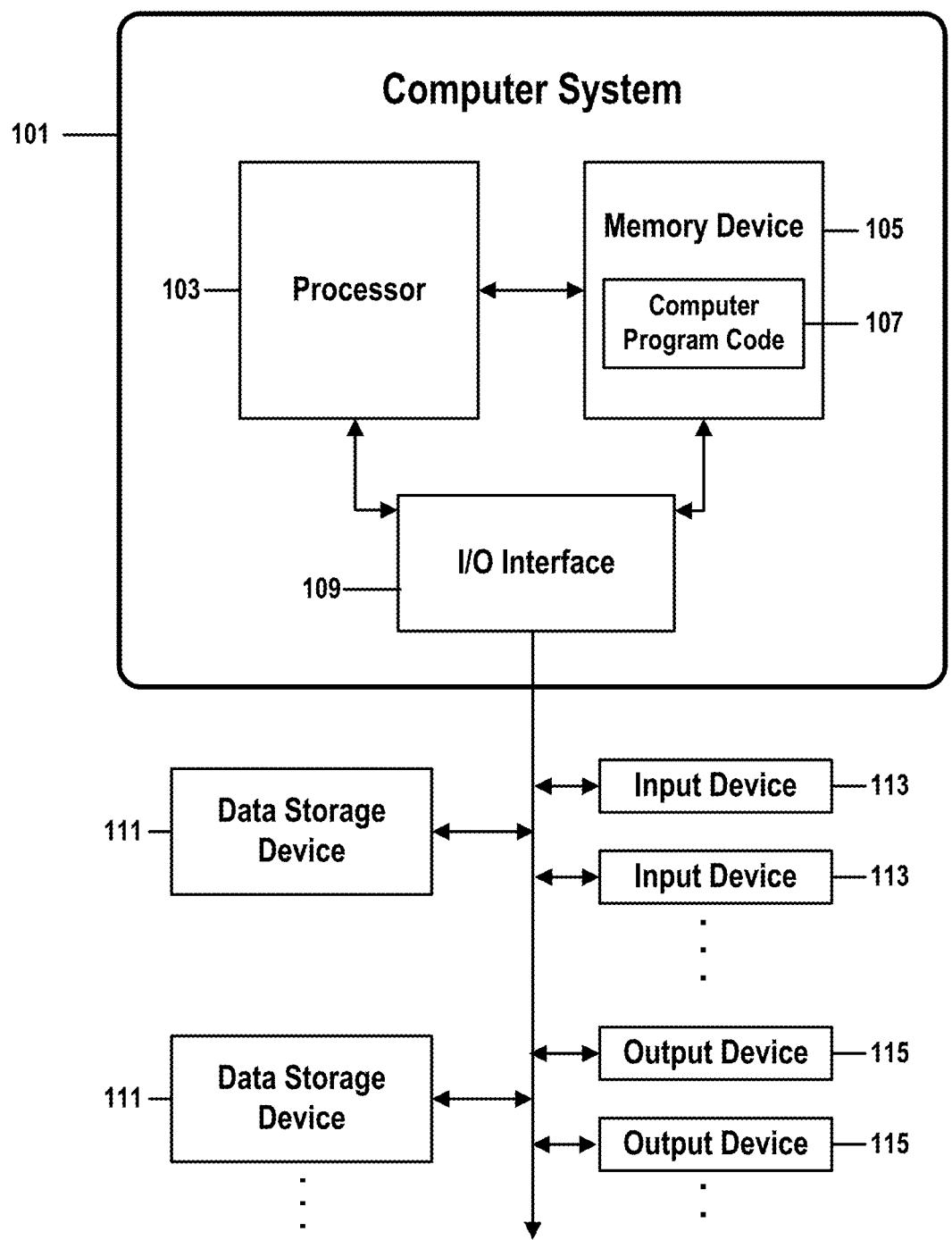
FIG. 1 shows the general structure of a computer system and computer program code that may be used to implement a method for building-information management system with directional wind propagation and diffusion in accordance with embodiments of the present invention.

FIG. 1 shows a structure of a computer system and computer program code that may be used to implement a method for building-information management system with directional wind propagation and diffusion in accordance with embodiments of the present invention. FIG. 1 refers to objects 101-115.

In FIG. 1, computer system 101 comprises a processor 103 coupled through one or more I/O Interfaces 109 to one or more hardware data storage devices 111 and one or more I/O devices 113 and 115.

Hardware data storage devices 111 may include, but are not limited to, magnetic tape drives, fixed or removable hard disks, optical discs, storage-equipped mobile devices, and solid-state random-access or read-only storage devices. I/O devices may comprise, but are not limited to: input devices 113, such as keyboards, scanners, handheld telecommunications devices, touch-sensitive displays, tablets, biometric readers, joysticks, trackballs, or computer mice; and output devices 115, which may comprise, but are not limited to printers, plotters, tablets, mobile telephones, displays, or sound-producing devices. Data storage devices 111, input devices 113, and output devices 115 may be located either locally or at remote sites from which they are connected to I/O Interface 109 through a network interface.

Processor 103 may also be connected to one or more memory devices 105, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 105 contains stored computer program code 107, which is a computer program that comprises computer-executable instructions. The stored computer program code includes a program that implements a method for building-information management system with directional wind propagation and diffusion in accordance with embodiments of the present invention, and may implement other embodiments described in this specification, including the methods illustrated in FIGS. 1-7. The data storage devices 111 may store the computer program code 107. Computer program code 107 stored in the storage devices 111 is configured to be executed by processor 103 via the memory devices 105. Processor 103 executes the stored computer program code 107.

In some embodiments, rather than being stored and accessed from a hard drive, optical disc or other writeable, rewriteable, or removable hardware data-storage device 111, stored computer program code 107 may be stored on a static, nonremovable, read-only storage medium such as a Read-Only Memory (ROM) device 105, or may be accessed by processor 103 directly from such a static, nonremovable, read-only medium 105. Similarly, in some embodiments, stored computer program code 107 may be stored as computer-readable firmware 105, or may be accessed by processor 103 directly from such firmware 105, rather than from a more dynamic or removable hardware data-storage device 111, such as a hard drive or optical disc.

Thus the present invention discloses a process for supporting computer infrastructure, integrating, hosting, maintaining, and deploying computer-readable code into the computer system 101, wherein the code in combination with the computer system 101 is capable of performing a method for building-information management system with directional wind propagation and diffusion.

Any of the components of the present invention could be created, integrated, hosted, maintained, deployed, managed, serviced, supported, etc. by a service provider who offers to facilitate a method for building-information management system with directional wind propagation and diffusion. Thus the present invention discloses a process for deploying or integrating computing infrastructure, comprising integrating computer-readable code into the computer system 101, wherein the code in combination with the computer system 101 is capable of performing a method for building-information management system with directional wind propagation and diffusion.

One or more data storage units 111 (or one or more additional memory devices not shown in FIG. 1) may be used as a computer-readable hardware storage device having a computer-readable program embodied therein and/or having other data stored therein, wherein the computer-readable program comprises stored computer program code 107. Generally, a computer program product (or, alternatively, an article of manufacture) of computer system 101 may comprise the computer-readable hardware storage device.

In embodiments that comprise components of a networked computing infrastructure, a cloud-computing environment, a client-server architecture, or other types of distributed platforms, functionality of the present invention may be implemented solely on a client or user device, may be implemented solely on a remote server or as a service of a cloud-computing platform, or may be split between local and remote components.

While it is understood that program code 107 for a method for building-information management system with directional wind propagation and diffusion may be deployed by manually loading the program code 107 directly into client, server, and proxy computers (not shown) by loading the program code 107 into a computer-readable storage medium (e.g., computer data storage device 111), program code 107 may also be automatically or semi-automatically deployed into computer system 101 by sending program code 107 to a central server (e.g., computer system 101) or to a group of central servers. Program code 107 may then be downloaded into client computers (not shown) that will execute program code 107.

Alternatively, program code 107 may be sent directly to the client computer via e-mail. Program code 107 may then either be detached to a directory on the client computer or loaded into a directory on the client computer by an e-mail option that selects a program that detaches program code 107 into the directory.

Another alternative is to send program code 107 directly to a directory on the client computer hard drive. If proxy servers are configured, the process selects the proxy server code, determines on which computers to place the proxy servers' code, transmits the proxy server code, and then installs the proxy server code on the proxy computer. Program code 107 is then transmitted to the proxy server and stored on the proxy server.

In one embodiment, program code 107 for a method for building-information management system with directional wind propagation and diffusion is integrated into a client, server and network environment by providing for program code 107 to coexist with software applications (not shown), operating systems (not shown) and network operating systems software (not shown) and then installing program code 107 on the clients and servers in the environment where program code 107 will function.

The first step of the aforementioned integration of code included in program code 107 is to identify any software on the clients and servers, including the network operating system (not shown), where program code 107 will be deployed that are required by program code 107 or that work in conjunction with program code 107. This identified software includes the network operating system, where the network operating system comprises software that enhances a basic operating system by adding networking features.

Next, the software applications and version numbers are identified and compared to a list of software applications and correct version numbers that have been tested to work with program code 107. A software application that is missing or that does not match a correct version number is upgraded to the correct version.

A program instruction that passes parameters from program code 107 to a software application is checked to ensure that the instruction's parameter list matches a parameter list required by the program code 107. Conversely, a parameter passed by the software application to program code 107 is checked to ensure that the parameter matches a parameter required by program code 107. The client and server operating systems, including the network operating systems, are identified and compared to a list of operating systems, version numbers, and network software programs that have been tested to work with program code 107. An operating system, version number, or network software program that does not match an entry of the list of tested operating systems and version numbers is upgraded to the listed level on the client computers and upgraded to the listed level on the server computers.

After ensuring that the software, where program code 107 is to be deployed, is at a correct version level that has been tested to work with program code 107, the integration is completed by installing program code 107 on the clients and servers.

Embodiments of the present invention may be implemented as a method performed by a processor of a computer system, as a computer program product, as a computer system, or as a processor-performed process or service for supporting computer infrastructure.

Figure 2:
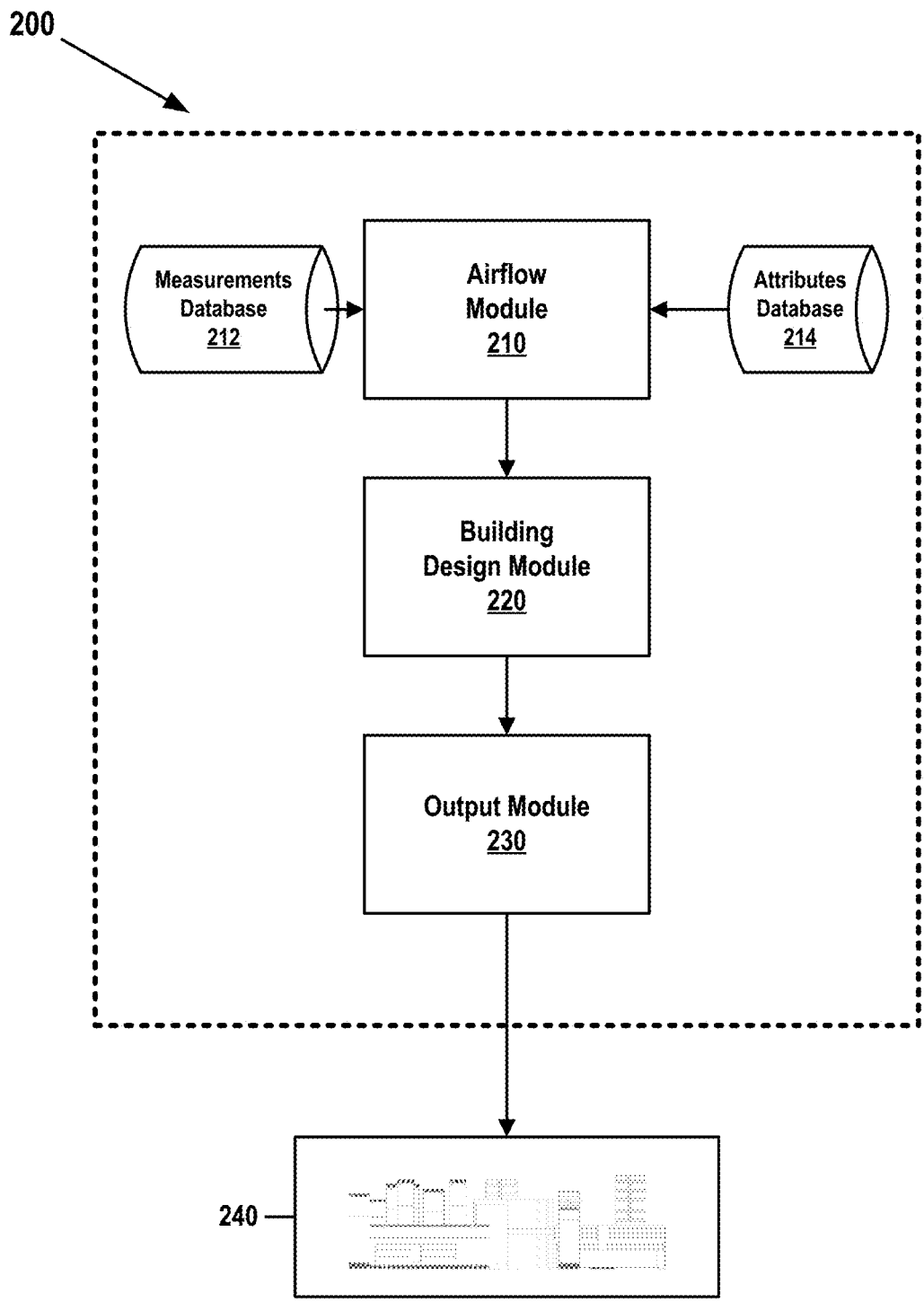
FIG. 2 shows a more specific or implementing a building-information management system with directional wind propagation and diffusion in accordance with embodiments of the present invention.

FIG. 2 shows a more specific architecture of a building-information management system with directional wind propagation and diffusion in accordance with embodiments of the present invention. FIG. 2 shows elements identified by reference numbers 200-240.

Item 200 is an improved Building Information System (BIM) that is enhanced, in accordance with embodiments of the present invention, with the ability to generate a 4D or 5D plan or model 240 for one or more buildings that accounts for directional air flows.

Items 212-230 are modules of BIM 200.

Item 210 is an airflow-analysis module that analyzes and models the interactions between external airflows and planned buildings or infrastructure represented in the plan 240. Item 210 performs this operation by means of methods described in FIGS. 3-7.

Analysis module 210 performs these operations as functions of information read from a measurements database 212, which stores sets of concurrently sampled empirical measurements of wind velocity and direction vectors (v,d) at points throughout the volume of space being analyzed, and an attributes database 214 that stores information about physical structures, and other physical entities capable of affecting airflow patterns, located within the volume of space. In some embodiments, the volume of space must be a volume of air, but other embodiments may comprise volumes of space are not volumes of air.

Item 220 comprises one or more design modules of BIM 200. These design modules 220 receive airflow parameters developed by item 210 and incorporate that information into the BIM model 240.

Item 230 is an output module of BIM 200. Using algorithmic methods that are known or algorithmic methods analogous to methods that are known in the art of building information systems, output module 230 generates BIM plan or model 240.

Building information model 240 is an intelligent model of one or more planned buildings or infrastructures, which may be forwarded to downstream software systems or applications, or which may be used to generate directions or plans for downstream professionals, such as contractors, civil engineers, licensing entities, or architectural specialists.

FIG. 3 is a flow chart that illustrates steps of a method for an improved building-information management system 200 with analysis of directional wind propagation and directional wind diffusion in accordance with embodiments of the present invention. FIG. 3 contains steps 300-360, which may be performed by embodiments that incorporate components and topologies of FIGS. 1 and 2.

In step 300, an airflow-analysis module 210 of an improved BIM 200 stratifies the volume of space into which the planned buildings or infrastructure will be built, into a set of horizontal layers. Each layer consists of a set of similar cross-sections of a subset of the volume, where each cross-section is characterized by a height, a vertical airflow (or wind) speed, and a direction of that cross-section's vertical airflow. Two cross-sections are deemed to be similar enough to be included in a same layer if the two cross-sectional areas are associated with similar airflow directions and similar airflow speeds, when airflow directions and airflow speeds are measured throughout the volume of space during a duration time short enough to ensure that the measured values are likely to persist throughout the volume concurrently.

A layer may contain cross-sections that are located at different heights, and the overall "height" of the layer is defined as the vertical distance between the layer's highest area and the layer's lowest area. Regardless of their heights, however, all areas of a single layer must identify similar vertical airflow directions and similar airflow speeds. This procedure is described in greater detail in FIG. 4.

In step 310, the analysis module 210 divides each layer into a grid of cells. Each grid of a particular layer contains rectangular cells of various dimensions and aspect ratios that are selected as a function of variations in the density of buildings and other physical structures within the height range of the layer. This factor is important because the presence of a physical structure can significantly affect the propagation and diffusion of proximate airflows. Each cell of a particular layer is thus a three-dimensional volume that defines a contiguous rectangular area of the layer's horizontal (xy) cross-section and that has a height along the z axis equal to the height of the layer. Each cell contains wind measurements that have similar wind speed/wind direction values and that were measured at points characterized by the specific building density associated with all coordinate points within that cell. This procedure is described in greater detail in FIG. 5.

In step 320, analysis module 210 derives a ventilation model for each cell. Each model identifies the direction and speed of that cell's aggregate input airflow and output airflow. This procedure is described in greater detail in FIG. 6, steps 600-650.

In step 330, analysis module 210 merges the resulting set of wind vectors for each horizontal layer, to generate generates a set of time-varying wind-propagation and diffusion values for each layer. This procedure is described in greater detail in FIG. 6, step 660.

In step 340, analysis module 210 uses the previously derived propagation and diffusion values to determine a time-varying "regional pattern" of wind-propagation and dispersion for the entire volume of air. This procedure is described in greater detail in FIG. 7.

In step 350, analysis module 210, through technical means analogous to those of current BIM systems, forwards a model of the regional pattern of airflow propagation and dispersion to design module 220 of BIM 200. The design module then, through methods and technologies known in the art, uses this forwarded information to revise the system's 4D or 5D BIM model in order to better select physical properties, locations, and orientations of each planned building or infrastructure component within the volume of air, or to better configure each planned building or infrastructure component's internal and external airflows, such as by configuring an HVAC system, ductwork, or external vents.

In step 360, output module 230 of BIM 200 outputs the final 4D or 5D model in forms that may be viewed, analyzed, or interactively revised by downstream users, or in forms that may be received as input by downstream systems. This procedure may be performed by means analogous to those currently implemented in known BIM systems.

Figure 4:
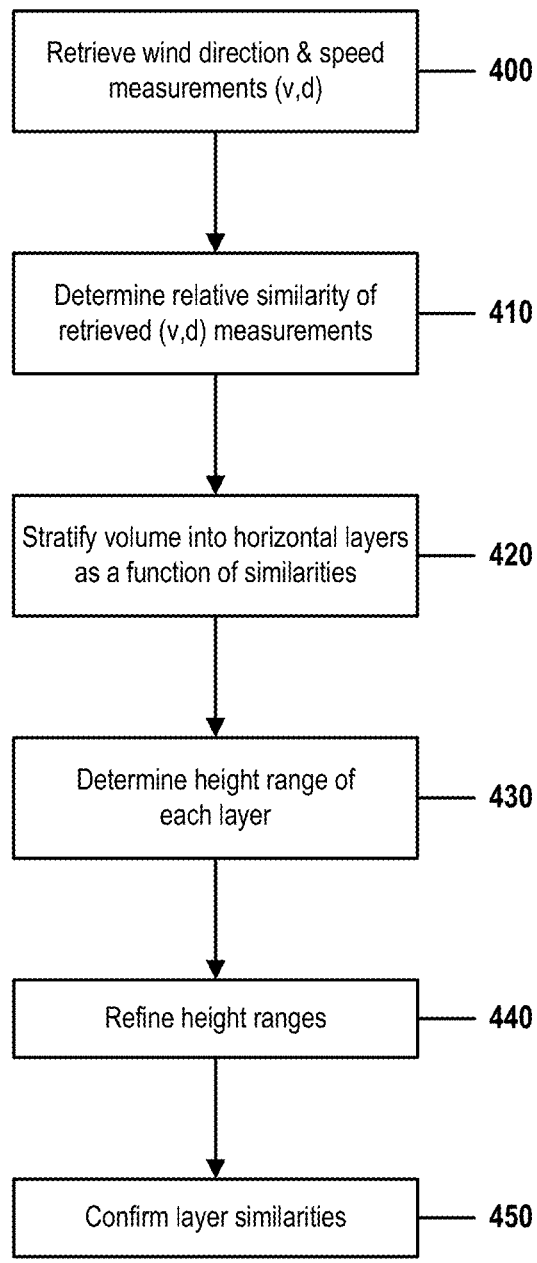
FIG. 4 is a flow chart that illustrates steps for vertical spatial stratification of a volume of space into a vertical stack of horizontal layers by an improved building-information management system in accordance with embodiments of the present invention.

FIG. 4 is a flow chart that illustrates steps for vertical spatial stratification of a volume of space into a vertical stack of horizontal layers by an improved building-information management system 200 in accordance with embodiments of the present invention. FIG. 4 contains steps 400-450, which may be performed by embodiments that incorporate components and topologies of FIGS. 1 and 2.

In step 400, airflow module 210 of BIM system 200 receives a set of wind speed and direction measurements. Each received measurement identifies a wind speed v and a wind direction d at a point within the three-dimensional volume of space that is being analyzed. Each measurement thus identifies a measured wind vector (v,d) collected at a point identified by coordinates (x,y,z).

These measurements may be collected and forwarded to the system 200 by any means known in the art. For example, measurements may be collected by hand at various points in space by means of handheld wind meters. In other cases, measurements may be collected by means of automated Internet of Things sensors connected through a network to a measurement application. Measurements may be made using electronic meters, sensors or anemometers mounted to the exteriors of buildings or other types of physical structures, or mounted on airborne devices, such as a drone or an inflatable device.

Embodiments of the present invention are flexible enough to accommodate any sort of sampling density desired by an implementer. For example, a measurement may be collected at each window of each building erected in the volume of space, one measurement may be collected at each floor of each building in the volume, or a measurement may be made at each vertex of a 1 m grid in the horizontal xy plane, and at each 5 m interval along the vertical z axis. An implementer may choose a custom sampling density and pattern based on technical, cost, or resource constraints, or as a function of a desired degree of accuracy or precision. In general, a greater measurement density will produce more accurate and precise results in steps 330-360, but will require greater computing resources.

Depending on embodiment-specific details, a (v,d) wind measurement may specify a wind speed in an "up" or "down" direction along the vertical z axis, a wind speed in a horizontal direction relative to North-South-East-West compass points, or a wind speed in three-dimensional space unconstrained in any direction. The embodiments and examples described in this document will, for the sake of simplicity, comprise only horizontal wind directions, but this should not be construed to restrict the present invention only to horizontal wind directions.

In step 410, the BIM airflow module 210 determines relative similarities among the values of each retrieved (v,d) wind speed and direction. This determination may be accomplished by any means known in the art, or by a combination of known means.

For example, the similarity between two (v,d) measurements may be quantified by determining a Euclidean distance between the two measurements, by performing a Cosine Similarity operation upon the two measurements, or by a averaging the results of these two metrics.

In other embodiments, other mathematical methods of identifying similarity may be used, and other methods of combining multiple similarity metrics may be used. For example, if three similarity scores are derived by three distinct computational methods, an overall similarity value may be determined by weighting each score according to an implementer's judgment of the relative accuracy of each computation or of the relative relevance of each score, and then adding or averaging the three weighted scores.

In step 420, the module 210 sorts the (v,d) measurements into layers, where each layer contains similar (v,d) measurements. Deeming two measurements to be similar may be performed by determining that the similarity determinations of step 410 produced a similarity value that exceeds a preselected threshold value.

The threshold value may be selected by any means known in the art, including by means of expert knowledge of a person skilled in the art. Embodiments of the present invention are flexible enough to accommodate any such selection. For example, a software designer familiar with building-information management applications may, through trial and error or through educated estimations, empirically select a threshold value that results in a number of layers large enough to provide a satisfactory degree of precision but small enough to require a practical computational load. In other cases, a machine-learning component or a convolutional neural network may, through mechanisms known in the art, automatically identify a threshold value that most consistently produces the compromise between computational load and accuracy of results.

In step 430, the module 210 sets a height range for each layer. This step is performed by identifying the maximum and minimum z-axis heights associated with the (v,d) measurements comprised by each layer. For example, if Layer 1 contains three (v,d) measurements collected at (x,y,z) coordinates (10 feet, 12 feet, 25 feet), (9 feet, 12 feet, 32 feet), and (10 feet, 11 feet, 2 feet), the height of Layer 1 would be deemed to extend from 2 feet (the lowest z coordinate of a (v,d) measurement comprised by Layer 1) to 32 feet ((the highest z coordinate of a (v,d) measurement comprised by Layer 1).

In step 440, module 210 reconciles any inconsistencies between the layer height ranges derived in the previous step.

For example, if two layers overlap in height, a compromise boundary is selected as a midpoint of the overlap range. For example, if a height range of Layer 1 is [2,32] and the height range of Layer 2 is [28,40], the boundary between the two would be set equal to (28+32)/2=30. The resulting height range of Layer 1 would then be [2,30] and the height range of Layer 2 would be [30,40].

A similar averaging procedure may be used to reconcile the height ranges of two adjacent layers if there is a gap between the height ranges of the two layers. For example, if a height range of Layer 1 is [2,32] and the height range of Layer 2 is [36,40], the boundary between the two would be set equal to (32+36)/2=34. The resulting height range of Layer 1 would then be [2,34] and the height range of Layer 2 would be [34,40].

Given the real-world properties of wind currents, it is unlikely that one layer would span a first height range that is a proper subset of a second layer's second range or that two layers would span identical height ranges. If such a configuration results, analysis of such data would fall outside the scope of the present invention. In such cases, embodiments of the present invention would continue the method of FIG. 4 by returning to step 400, in order to retrieve additional measurement data capable of resolving such unlikely inconsistencies.

In optional step 450, module 210 confirms that the vertical stratification of the volume of space into layers has resulted in a division of the volume into a set of vertical layers, such that each layer contains a set of (v,d) measurements that are sufficiently similar to each other and that are sufficiently dissimilar to measurements in other layers.

This confirmation may be performed by any means known in the art. For example, a "t-test" (also known as a "student T-test"), which determines and quantifies a degree of similarity between two populations may be used to determine a degree of similarity between a set of (v,d) values of a first layer and the total population of (v,d) measurements retrieved in step 400. By performing this mathematical procedure on each layer, it is possible to determine whether a layer contains values that have been selected with too much or too little similarity to each other. A t-test may also detect the presence of any outlier measurements that had not been clustered into any layer in step 410 because the outlier measurements were not sufficiently similar to measurements in any layer.

If the determination performed in this step reveals that the height ranges of the layers have not been selected to provide sufficiently similarity among measurements located in the same layer, and have not been selected to provide sufficient dissimilarity between measurements located in different layers, then the method of FIG. 4 may return to step 400 or 410, to either retrieve additional measurement points, or to repeat the determination of relative similarity of measurement values with threshold values lowered such that measurement vectors in the same layer are required to be have greater similarity.

Similarly, if the system in step 450 determines that the layers are too large, thus containing measurements that are not similar enough to each other, the threshold value might be incrementally reduced, such that a greater degree of similarity is required in order to include two "similar" vectors in the same layer. And if the system in step 450 determines that there are too many layers, resulting in measurements comprised by one layer being too similar to measurements comprised by another layer, the threshold values might be incrementally increased, such that a layer is allowed to include measurement vectors that are less similar to each other.

At the conclusion of the method of FIG. 4, a set of previously obtained pairs of wind-speed and wind-direction measurements will have been organized by height into vertically stacked horizontal layers, such that there is no significant difference among wind-speed and direction values within the same layer.

Certain computational steps of FIG. 4 may be illustrated by the following example:

In step 400, a set of measurement vectors (v,d), including a specific pair of vectors V1(v1,d1) and V2(v2,d2), are retrieved from measurements database 212.

In step 410, the relative similarity of each pair of retrieved vectors is determined by means of two different mathematical procedures known in the art: a calculation of the Euclidean Distance between the two vectors, and a Cosine Similarity test, which determines similarity as a function of the cosine of the angle between the two vectors. The exemplary embodiment will then quantify the similarity between the pair of vectors as the average of the results of these two computations and deem the two vectors similar if the resulting similarity value is less than an empirically determined threshold value of 0.5.

In this example, a Cosine Similarity of the vector pair CS(V2,V2) may equal 0.4 and a Euclidean Distance between vector V1 and vector V2 may be computed to equal 0.3. The average between the two would be (0.4+0.3)/2=0.35, which is less than the threshold value 0.5, indicating that measurements (v1,d1) and (v2,d2) are similar enough to be included in the same layer.

Once all sampled (v,d) measurements have been sorted into layers, the system may optionally double-check whether the measurements in each layer are indeed similar to each other and dissimilar to measurements in other layers. If desired, this step may be performed by any means known in the art, such as by subjecting the measurements in each layer to a student t-test computation.

For example, the system may use a t-test to determine whether the sample X={(v1,d1), (v2, d2), . . . (vn,dn)} of n (v,d) measurements comprised by Layer 1 is sufficiently similar to the entire population of (v,d) measurements retrieved in step 400. This could be performed for Layer 1 by means of the equation:

$$t = \frac{Z}{s} = \frac{(\overline{X} - \mu)/(\sigma/\sqrt{n})}{s}$$

$\overline{X}$ is the mean value of the n (v,d) values contained in Layer1, $\mu$ is the mean value of the entire population of retrieved measurements, $\sigma$ is the standard deviation of the entire population of retrieved measurements, and s is the ratio of the standard deviation of the sample population X divided by the standard deviation of the entire population of retrieved measurements. This computation results in a relative similarity t of the measurements of Layer 1 to the total population of retrieved measurements.

In this example, if t is greater than a t-test threshold value of 0.5, then the t-test would have determined that the (v,d) measurements comprised by Layer 1 are, on whole, unacceptably similar to other measurements of the entire set of retrieved measurements. In that case, some embodiments would then repeat earlier steps of FIG. 4 with more stringent similarity thresholds in order to ensure that the measurements contained in a layer have greater similarity to each other.

At the conclusion of steps 430 and 440, which adjust the height ranges of each resulting layer, the airflow module 210 performs a t-test computation upon each pair of layers. In each computation, the t-test determines the overall similarity or dissimilarity between a population of measurements of one of the layers and the overall population of measurement points retrieved in step 400. In addition to revealing whether the layers have been stratified optimally, this test will detect the presence of any outlier measurements that were not included in any layer in step 410 because the outlier measurements were not sufficiently similar to any other measurements.

Figure 5:
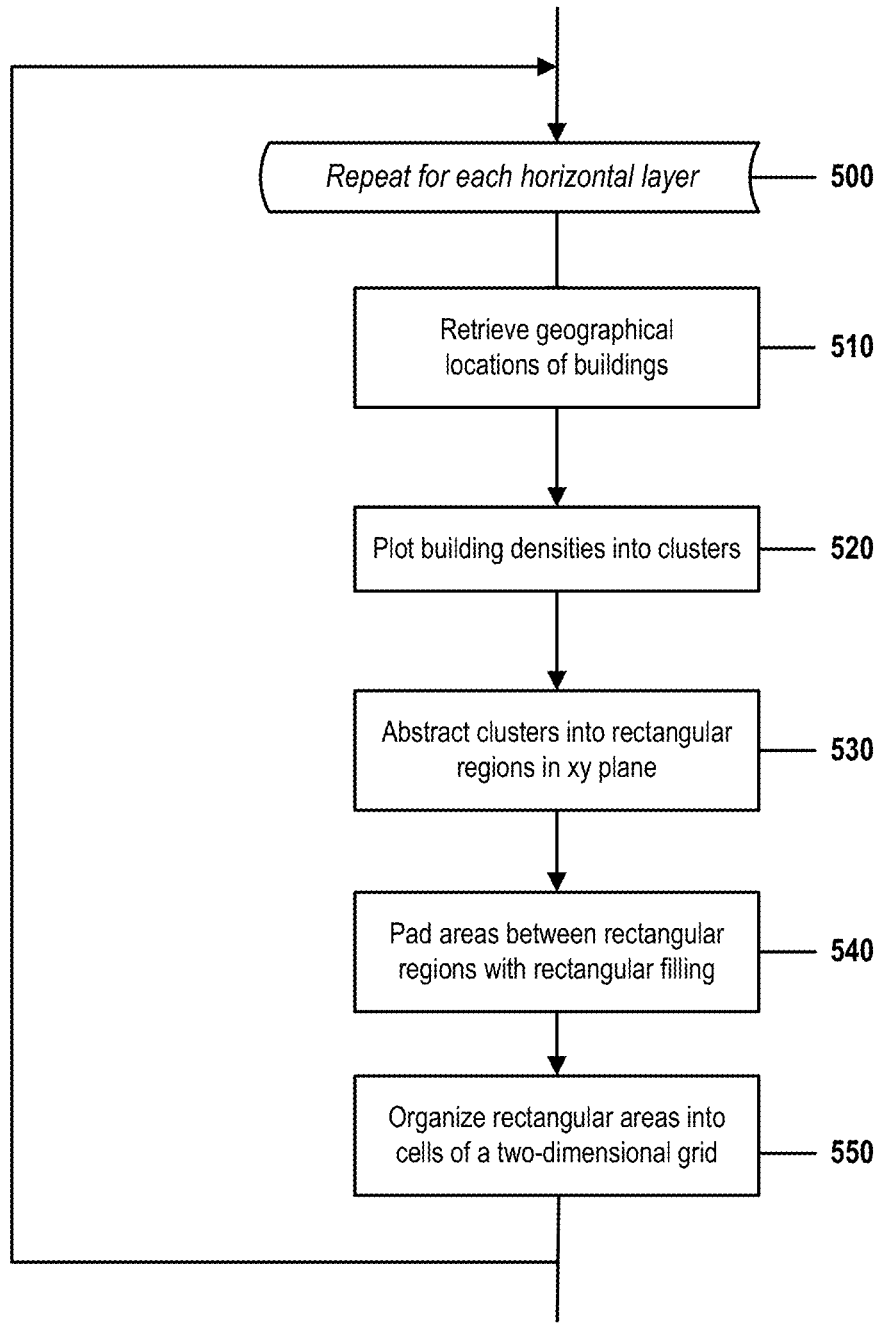
FIG. 5 is a flow chart that illustrates steps for partitioning a previously generated horizontal layer in accordance with embodiments of the present invention.

FIG. 5 is a flow chart that illustrates steps for partitioning a previously generated horizontal layer in accordance with embodiments of the present invention. FIG. 5 contains steps 500-550, which may be performed by embodiments that incorporate components and topologies of FIGS. 1 and 2.

The method of FIG. 4 previously stratified a volume of space into a vertically stacked set of horizontal layers, and then divided a set of (v,d) wind measurements among the layers, such that each layer contains similar measurement values. This procedure assumes that the wind measurements vary monotonically and continuously along the vertical z axis, such that measurement values within a continuous range were collected at coordinate points that fall within a continuous range of heights within the volume of space. Therefore, when further processing a particular layer's population of measurements, that layer's measurements may be processed without the need to account for the vertical z component of each measurement's three-dimensional coordinates.

The method of FIG. 5 performs an analogous procedure for each horizontal layer by dividing each layer into a grid of cells. Unlike the vertical stratification procedure, however, this horizontal division is performed to account for the effect that the density of buildings and other structures, located within the layer's height range, asserts on airflow characteristics like wind propagation, diffusion, and decay rate. For example, the efficiency of wind propagation can be high in an area where physical structures are widely dispersed, but may decrease rapidly as increasing building-density results in a higher density of physical structures capable of interrupting or diverting airflows.

Each rectangular cell in a particular layer's grid may have different dimensions in the x-y plane, but all cells within the same layer have a height equal to the height of that layer. Wind-speed and wind-direction measurements that are located within the same cell will have similar (v,d) values and will have been collected at collection points where the density of physical structures matches the specific density associated with the entire cell.

The method of FIG. 5 thus uses known density based clustering algorithms (such as the known DBSCAN computation) to cluster measurements in a layer into cells as a function of the geographical location of buildings in the volume of space and within the range of heights associated with the layer.

Step 500 begins an iterative procedure of steps 500-550, which is repeated once for each horizontal layer, of the volume of space, generated in FIG. 4.

In step 510, airflow analysis module 210 retrieves a list of the geographical locations and, in some embodiments, the physical dimensions of buildings, infrastructure elements, and other physical structures within the volume of space. This information is sufficient to identify the density of these structures within an xy-plane cross-section of the volume of space in the height range of the layer currently being processed by the method of FIG. 5.

In step 520, the airflow module 210 groups the building and structure location data into clusters, where each cluster contains locations that are more closely packed together in space on the current layer. Because all entities comprised by a particular layer are deemed to be located at similar heights, this clustering may be performed solely in the xy dimension.

Any spatial clustering means known in the art may be used for this step. In one example, step 520 may be performed by performing a known DBSCAN (density-based spatial clustering of applications with noise) algorithm upon a subset of the building data retrieved in step 500, where locations specified by the subset each comprise a z-axis coordinate that falls within the height range of the current layer.

In step 530, airflow module 210 represents each cluster as a rectangular cell in the xy plane that has a height equal to the height range of the current cluster. Each cell has x and y dimensions sufficient to comprise the xy coordinates of all buildings located within the area of the rectangular cell.

In step 540, airflow module 210 fills in the gaps between the cells created in step 530 with a cell that is devoid of physical structures.

In step 550, airflow module 210 organizes the cells created in steps 530 and 540 into a two-dimensional grid that may cover, the entire cross-sectional area of the current layer in the (xy) plane. Each cell in this grid may contain measurement values (v,d) retrieved in step 400 that have (x,y) coordinates falling within the boundaries of that cell and a y coordinate that falls within the height range of the layer.

At the conclusion of the final iteration of the method of FIG. 5, each layer will have been further divided by this procedure into a grid of rectangular cells. Cells of a particular grid may differ in size and aspect ratio, and each layer's grid may be distinct from grids of adjacent layers.

The DBSCAN algorithm divides the area into clusters per the density, and more concentrated buildings are divided into one cluster. Each cluster is abstracted into a square cell, and for the area between adjacent cells using new square cell filling, and so on. Then we get a group of cells in the entire simulation layer. Because of different cell size, we store the cell information as a graph, as well as the adjacent cell information.

FIG. 6 is a flow chart that illustrates steps for generating propagation and diffusion values for cells and layers of a previously generated horizontal layer in accordance with embodiments of the present invention. FIG. 6 contains steps 600-660, which may be performed by embodiments that incorporate components and topologies of FIGS. 1 and 2.

The method of FIG. 6 determines "ventilation rates" for each grid cell on each layer, where each cell's ventilation rate identifies a relationship between airflows blowing into the cell and airflows blowing out of the cell in each north, south, east, or west horizontal direction. For example, a higher ventilation rate along the north axis means that a larger portion of a northerly wind entering a cell is propagated as an outgoing airflow exiting the cell in the same direction.

In real-world applications, input and output wind speeds may fluctuate wildly, making it difficult to accurately quantize a cell's input wind speeds and output wind speeds in real-time, or to estimate input and output wind speeds as functions of empirical measurements. Wind-speed decay rates, for example, can depend greatly upon the orientation of adjacent buildings. An east-west wall affects the decay rate of north-south wind in a manner greatly different from the way that the wall affects the decay rate of east-west wind.

Embodiments of the present invention thus use a multi-step procedure to estimate and refine ventilation rates of a larger volume of air, by first estimating directional decay rates of each rectangular cell within a horizontal layer, refining the cellular rates by means of known techniques of machine learning that model input and output speeds and decay rates as functions of attributes of the cell and its internal structures, aggregating the cellular rates to generate layer-wide properties, and then combining the layer-specific properties into a set of directional characteristics of the entire air volume. The resulting models will then automatically derive outgoing wind vectors of a volume of air as a function of an incoming airflow.

At the conclusion of the method of FIG. 6, the system will have derived a set of directional input and output wind vectors for every cell at continuous points in time. These vectors may be aggregated in order to determine dynamic wind-propagation characteristics of the entire layer, which will then be further combined by the method of FIG. 7 to derive propagation and diffusion characteristics of the entire volume of space.

Step 600 begins a top-level iterative procedure of steps 600-660, which is repeated once for each horizontal layer generated in FIG. 4.

Step 610 begins an inner-nested iterative procedure of steps 600-650, which is repeated once for each cell of the horizontal layer currently being processed by the top-level iterative procedure of steps 600-660.

In step 620, the airflow analysis module 210 of a BIM system 200 retrieves, from attributes database 214, attribute data for the cell currently being processed. This attribute data may comprise:

cell attributes, such as the total area of the cell or the cell's location or linear dimensions;

object attributes that identify characteristics of three-dimensional objects located within the cell. These characteristics may, for example, comprise an object type (identifying an object as a building, physical infrastructure component, and other type of physical structure) or an object's dimensions, orientation, or location;

object projection areas, which identify the surface area of a shadow-like two-dimensional projection of a three-dimensional object, located within the cell, onto the xy, xz, or yz plane; these projections simplify the modeling of the physical effects of airflow components flowing in a north, south, east, or west direction; and object ventilation ratios, which identify a ratio between an output airflow of an object located within the cell and an input airflow of the same object. For example, a ventilation ratio of a solid wall of an apartment building ventilation would be 0, signifying that none of an input airflow penetrates the wall; while a ventilation ratio of a trellis-like structure might be 0.95, identifying that 95% of the input wind blowing onto the trellis passes through the structure.

In certain embodiments, other attributes, as might be required by implementation-specific details, may also be retrieved from the attributes database 214.

In step 630, the airflow analysis module 210 of a BIM system 200 estimates a set of directional wind-speed decay rates $rate_i$ for each cell, $i \in \{north, south, east, west\}$, using equations analogous to or similar to Equation (1):

$$rate_i = \frac{(speed_{out} - speed_{in})}{speed_{in}} \times 100\% \quad (1)$$

In this equation, $speed_{out}$ is the output wind speed of airflows traveling out of the cell along the i direction, and $speed_{in}$ is the input wind speed of airflows traveling into the cell along the i direction. Each input wind speed or output wind speed is selected from (v,d) wind-speed measurements collected at locations within the boundaries of the cell and closest to a boundary of the cell. If multiple measurements exist on or within close proximity to a boundary, the highest magnitude measurement in each direction is selected.

For example, if three (v,d) measurements located on boundaries of a cell identify values: (10,east), (−3,east), and (2,east), module 210 would select a $speed_{out}$ value for easterly windflow of 3 (the highest-amplitude outgoing easterly wind speed) and a $speed_{in}$ value for easterly windflow of 10 (the highest-amplitude incoming easterly wind speed).

Equation (1) would thus derive an easterly decay rate equal to:

$$rate_{East} = (3-10)/10 \times 100\% = -70\%$$

meaning that structures within the cell attenuate easterly winds by 70%.

Note that, in some embodiments, decay rates of inverse airflow directions are always complementary. That is, a 40% decay rate in the easterly direction would imply a −40% decay rate in the westerly direction. In other embodiments, however, (v,d) measurements that decouple wind speeds in inverse airflow directions (that is, measurements that, for example, represent an easterly v value of −30 as a value of +30 in the westerly direction) may reveal asymmetries, such that a 40% easterly decay rate may not automatically imply a −40% westerly decay rate, or may not automatically imply such a conclusion unless no westerly airflow measurements exist. Such results may be derived in embodiments capable of accounting for more complex interactions among airflows around physical objects located within a cell.

In some embodiments, airflow module 210 may also use certain elements of the attributes and other information retrieved from attributes database 214 to further refine the decay rates determined in step 630. Many embodiments, however, including those cites as examples in this document, generate mere first-order estimates of decay rates in step 630, assuming a simplified model of the area within a cell, wherein airflow speeds are consistent over time and the cell contains at most sparsely distributed physical structures that have little effect on airflows.

In step 640, the airflow module 210 uses known methods of artificial intelligence to infer relationships between the retrieved cell attributes and the cell's wind-speed decay rates. These methods may comprise a combination of cognitive and computational methods, such as convolutional neural networks, back-propagation neural networks, machine-learning methodologies, or cognitive methods of analytics.

In particular, some embodiments may use the known technology of convolutional neural networks (CNNs) to make such inferences. In such cases, the airflow module 210 might submit to an input layer of a CNN the previously selected most-significant input and output wind speeds and the attributes retrieved from the attributes database 214. The CNN would then determine how the resulting wind-speed decay rates relate to the attributes. When fully trained, after performing this process numerous times for multiple cells, the CNN would begin to learn how to determine a cell's wind-speed decay rates as a function of attributes of objects within the cell.

In step 650, the airflow module 210 uses known methods of data mining or artificial intelligence, such as machine learning, to infer association rules that define, as functions of the retrieved cell attributes and (v,d) measurements, the cell's effect on the direction of airflows passing through the cell. Here, each association rule associates an input wind traveling in a first direction with a likelihood that objects within the cell will redirect the input wind to a second, output, direction.

These methods may also comprise a combination of other types of cognitive and computational methods, such as convolutional neural networks, back-propagation neural networks, and cognitive analytics.

Embodiments of the present invention may simplify this inferential procedure by assuming that characteristics of wind direction within a cell are sole function of the attributes, density, and locations of the objects within in the cell, making those characteristics relatively static, regardless of the speed or direction of incoming airflows.

This assumption allows a neural network or other cognitive application to more easily develop association rules that associate a cell's input wind directions with the cell's output wind directions. Each discovered rule associates a wind direction into a cell with a wind direction out of a cell, along with other parameters that are known in the art to be related to association rules, such as a "support" value, which (given an association rule stating that first input wind direction into a cell gives rise to a first output wind direction out of a cell) identifies how frequently the first input wind direction appears in the entire data set of wind-direction values submitted to the neural network; and a "confidence" value that indicates how often the association rule is found to produce accurate results.

At the conclusion of this step, the airflow module 210 will have inferred a set of association rules that associate one of the for possible input wind directions capable of blowing into a cell with an output wind direction blowing out of the cell. In some embodiments, multiple association rules may be associated with the same input wind direction, where each rule is characterized by a confidence factor that indicates a likelihood that the rule correctly associates the input wind direction with an associated output wind direction.

The rules and inferred relationships generated by steps 640 and 650 thus define a function or model that determines how an input wind entering the current cell with a distinct input speed and velocity will be transformed while passing objects within the cell into an output wind that has a distinct output speed and direction.

In step 660, the airflow module 210 combines the wind-speed propagation and wind-direction characteristics of airflows entering the entire layer currently being processed by the outer iterative procedure of steps 600-660. Airflow module 210 performs this task as a function of the decay rates and association rules derived for each cell of the current layer during the previous iterations of the inner nested loop of steps 600-650.

Steps 600-650 have already derived decay rates in all four directions for every cell on the current layer and have already derived association rules that identify the direction of an output wind flowing out of each cell as a function of the directions of input wells flowing into that cell. Therefore, if the input wind vectors of a cell, in all four directions, are known, the previously derived decay rates and association rules allow the cell's output wind speed and direction to be determined.

Because a cell can only receive airflows from adjacent cells, airflow module 210 in this step determines a cell's input wind speed and direction by summing the output wind speed of each neighbor cell in each direction. This allows new output wind speeds and output wind directions to be derived for cells along an edge of the layer, so long as even a single (v,d) wind vector identifies an initial, measured, input wind speed and input wind direction along the edge of the layer.

Once new output-wind vectors have been derived for one or more cells along that edge of the layer, this procedure is repeated for the one or more cell's neighbors, using the one or more cell's newly derived output wind-speed and output wind-direction values (v,d) as input wind vectors for the neighbors. The airflow module 210 then, as before, derives new output-wind vectors for each neighbor. This process continues iteratively across the entire layer until new output wind values have been derived for every cell in the layer.

In some embodiments, a particular cell may be adjacent to more than one cell that propagates an airflow into the particular cell in a certain direction. In such cases, implementers may choose to set the particular cell's input wind speed in that direction equal to the greatest-magnitude airflow of those propagated airflows. In other embodiments, an implementer may choose to set the particular cell's input wind speed in that direction to the sum of all the airflows propagated by adjacent cells in that direction.

At the conclusion of these actions, some embodiments of airflow module 210 may then optionally repeat all of step 660 for the entire layer, using each cell's newly revised output wind vectors to derive the next generation of wind vectors at the next point in time. By continually repeating this procedure, the embodiment may derive a dynamic, time-varying model of the layer's airflows through a period of time, and where each iteration of step 660 generates a new set of airflows that occur during the next unit of time, as a function of the airflows generated during the previous iteration. In other embodiments, this repeating may be performed at the conclusion of the procedure of FIG. 7 in order to develop a time-varying model of the wind propagation and diffusion characteristics of the entire volume of air, rather than merely of a single layer.

At the conclusion of the last iteration of the outer iterative procedure of steps 600-660, the airflow module 210 will have derived an analogous airflow propagation and diffusion module for each layer in the volume of space.

Figure 7:
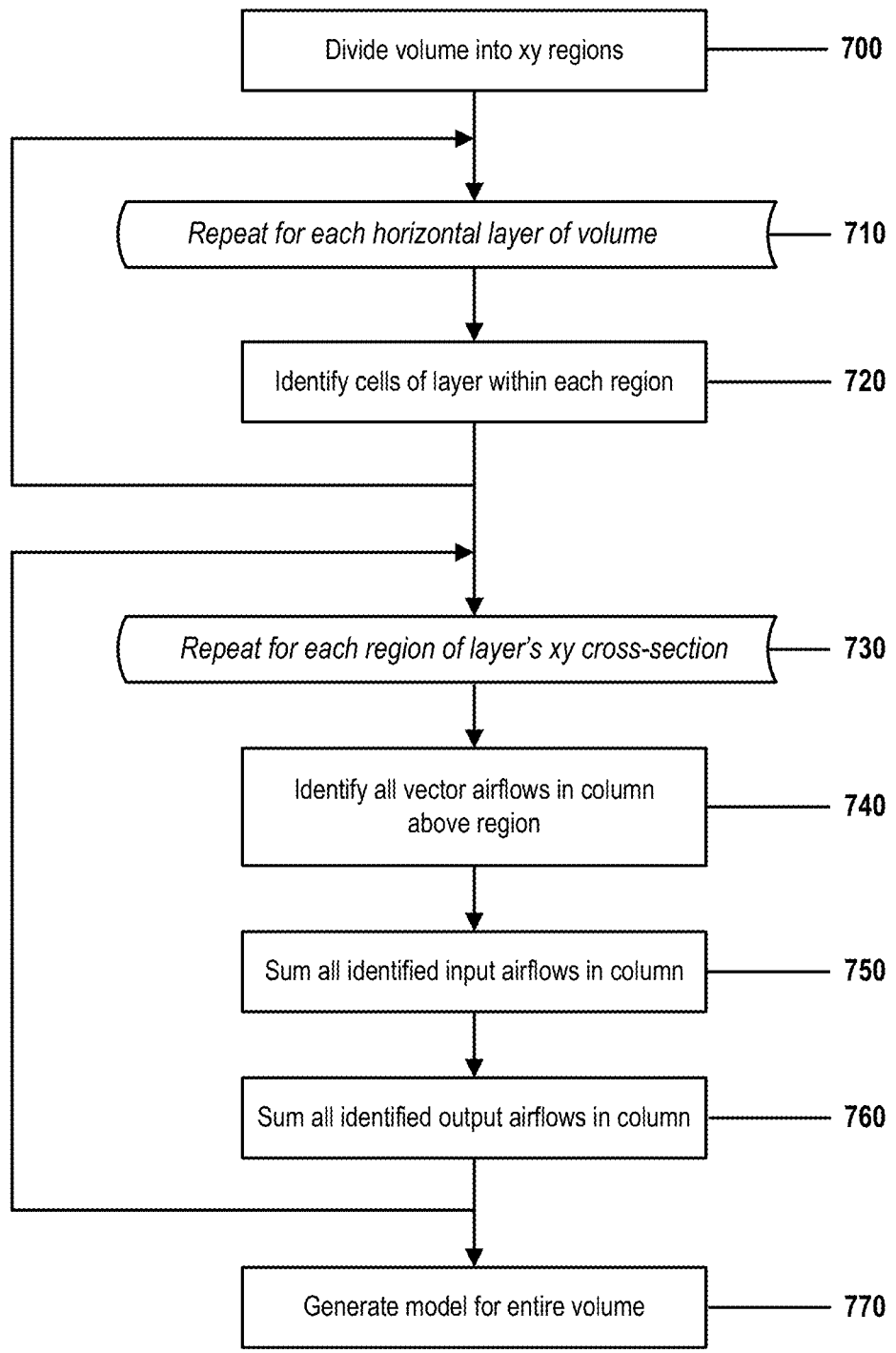
FIG. 7 is a flow chart that illustrates steps for aggregating propagation and diffusion values for each horizontal layer of a volume of space into a regional airflow model of the entire volume, in accordance with embodiments of the present invention.

FIG. 7 is a flow chart that illustrates steps for aggregating propagation and diffusion values for each horizontal layer of a volume of space into a regional airflow model of the entire volume. FIG. 7 contains steps 700-770 which may be performed by embodiments that incorporate components and topologies of FIGS. 1 and 2.

In step 700, airflow module 210 divides an xy-plane cross-section of the volume of space into a set of smaller regions. In some embodiments, these divisions may comprise a grid of rectangular areas, where all the rectangular areas have the same linear dimensions. In other embodiments, these divisions may comprise a grid that is similar or identical to the grid of heterogeneous cells previously generated on one of the horizontal layers, such as the uppermost layer, or the lowermost layer. The present invention is flexible enough to accommodate any sort of method of defining the total number of regions, the density of the regions within the cross-section, the location of each region in the xy plane, and the linear dimensions of each region, as desired by an implementer. In all cases, however, the regions may not overlap and must cover all cross-sectional areas of the volume of space for which an input wind or output wind has been derived.

Step 710 begins an iterative procedure of steps 710-720, which is performed once by airflow analysis module 210 for each layer of the volume.

In step 720, airflow module 210 identifies which regions, defined in step 710, share horizontal xy space with each cell of the current layer.

At the conclusion of the last iteration of the iterative procedure of steps 710-720, the airflow module 210 will have identified one or more cells on each horizontal layer that correspond to each cross-sectional region identified in step 700.

Step 730 begins an iterative procedure of steps 730-760, which is performed once by airflow analysis module 210 for each horizontal xy-plane of the cross-section of the volume of space selected in step 700.

In step 740, airflow module 210 aggregates the results of each iteration of the procedure of steps 710-720 for the current region, identifying all vertically stacked cells of all layers that overlap the region in horizontal xy space.

In step 750, airflow module 210 uses known methods of vector addition to sum the input airflows of the vertically stacked cells identified in step 740. This sum identifies the input wind speed and input wind direction of the entire vertical column of the volume of space that falls within the horizontal xy coordinates of the region.

In step 760, airflow module 210, in a similar manner, uses known methods of vector addition to sum the output airflows of the vertically stacked cells identified in step 740. This sum identifies the output wind speed and output wind direction of the entire vertical column of the volume of space that falls within the horizontal xy coordinates of the region.

At the conclusion of the last iteration of the iterative procedure of steps 730-760, the airflow module 210 will have determined input wind vectors and corresponding output wind vectors for every horizontal region of the volume of space. In effect, the input and output wind vectors of every layer will have been combined to form a set of height-independent decay rates, propagation functions, and diffusion functions.

In step 770, the airflow module 210 uses steps analogous to those of FIG. 6 to generate a regional airflow model of the entire volume of space. When provided with one or more external input wind vectors, this model may be used to determine airflow characteristics throughout the xy plane of the volume of space, in order to automatically generate output wind vectors.

In a manner analogous to the method of FIG. 6, this model may be used to generate dynamic wind propagation and diffusion characteristics by iteratively deriving multiple generations of output wind vectors throughout a duration of time.

This model may also be used by downstream modules of the BIM system 200 for functions like "what-if" analyses and airflow optimizations, in order to facilitate the design of buildings and of building models that optimize a planned building's effect on external airflows and the effect of external airflows on performance characteristics of the building. This information may, for example, allow the BIM 200 to more accurately select a location, orientation, and dimensions of a planned building in order to avoid undesirable environmental effects, or allow the BIM 200 to design a building with more efficient ventilation systems, air ducts, and external vent placement.

Examples and embodiments of the present invention described in this document have been presented for illustrative purposes. They should not be construed to be exhaustive nor to limit embodiments of the present invention to the examples and embodiments described here. Many other modifications and variations of the present invention that do not depart from the scope and spirit of these examples and embodiments will be apparent to those possessed of ordinary skill in the art. The terminology used in this document was chosen to best explain the principles underlying these examples and embodiments, in order to illustrate practical applications and technical improvements of the present invention over known technologies and products, and to enable readers of ordinary skill in the art to better understand the examples and embodiments disclosed here.

What is claimed is:

1. A building-information management system comprising a processor, a memory coupled to the processor, and a computer-readable hardware storage device coupled to the processor, the storage device containing program code configured to be run by the processor via the memory to implement a method for a building-information management system with directional wind propagation and diffusion, the method comprising:

the processor receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;

the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;

the processor retrieving a set of building attributes that identify locations and physical dimensions of buildings located within the volume of space;

the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;

the processor selecting, as a function of those received wind vectors that were measured at measurement points comprised by the first cell, an input wind speed of the first cell in each horizontal wind direction and an output wind speed of the first cell in each horizontal wind direction, where each horizontal wind direction is selected from the group consisting of northerly, southerly, easterly, and westerly, and where the selecting an input wind speed of the first cell in each horizontal wind direction and an output wind speed of the first cell in each horizontal wind direction further comprises:

the processor identifying a first subset of the set of measurement points and a second subset of the set of measurement points, where the first subset and the second subset both consist of measurement points located along boundaries of the first cell, where each wind vector measured at a measurement point of the first subset specifies wind traveling into the first cell parallel to a first direction of the group of horizontal wind directions, and where each wind vector measured at a measurement point of the second subset specifies wind traveling out of the first cell parallel to the first direction;

the processor setting an input wind speed of the first cell in the first direction equal to a highest-magnitude wind speed specified by any wind vector measured at a measurement point of the first subset;

the processor choosing an output wind speed of the first cell in the first direction equal to a highest-magnitude wind speed specified by any wind vector measured at a measurement point of the second subset; and the processor repeating the identifying, the setting, and the choosing for each of the remaining three directions of the group of horizontal wind directions;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

2. The system of claim 1,
where measurement points comprised by the first layer of the horizontal layers correspond to a first set of measured wind vectors,
where all values of the first set of measured wind vectors are similar, and
where no value of the first set of measured wind vectors is similar to a value of a wind vector associated with a measurement point comprised by a different layer of the horizontal layers.

3. The system of claim 2,
where two wind vectors are deemed to be similar if a Euclidean distance between the vectors does not exceed a predetermined threshold value.

4. The system of claim 2,
where two wind vectors are deemed to be similar if a Cosine Similarity of the two wind vectors does not exceed a predetermined threshold value.

5. The system of claim 1,
where boundaries of each cell are chosen such that each cell encloses cross-sections of an entire cluster of buildings and encloses cross-sections of no other buildings, and
where buildings are organized into clusters by application of a DBSCAN (density-based spatial clustering of applications with noise) algorithm to the buildings located within the volume of space.

6. The system of claim 1, where the employing further comprises:
the processor inferring a set of association rules that each specify that winds entering the first cell from a triggering input-wind direction must exit the first cell from an associated output-wind direction, where the triggering input-wind direction and the associated output-wind direction are both selected from the group of horizontal wind directions; and
the processor incorporating the association rules into the wind-propagation model.

7. The system of claim 6, further comprising:
the processor building a layer-ventilation model of the first layer as functions of the wind-speed decay rates, inferred relationships, and inferred association rules of each cell of the first layer, where the layer-ventilation model comprises rules for determining wind vectors of winds traveling out of the first layer as a function of values of wind vectors of winds traveling into the layer;
the processor aggregating the layer-ventilation models of all horizontal layers of the volume into a regional ventilation model; and
the processor incorporating the regional model into the wind-propagation model of the volume of space.

8. A method for a building-information management system with directional wind propagation and diffusion, the method comprising:
a processor of the building-information management system receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;
the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;
the processor retrieving a set of building attributes that identify locations and physical dimensions of buildings located within the volume of space;
the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;
the processor selecting, as a function of those received wind vectors that were measured at measurement points comprised by the first cell, an input wind speed of the first cell in each horizontal wind direction and an output wind speed of the first cell in each horizontal wind direction,
where each horizontal wind direction is selected from the group consisting of northerly, southerly, easterly, and westerly, and
where the selecting an input wind speed of the first cell in each horizontal wind direction and an output wind speed of the first cell in each horizontal wind direction further comprises:
the processor identifying a first subset of the set of measurement points and a second subset of the set of measurement points,
where the first subset and the second subset both consist of measurement points located along boundaries of the first cell,
where each wind vector measured at a measurement point of the first subset specifies wind traveling into the first cell parallel to a first direction of the group of horizontal wind directions, and where each wind vector measured at a measurement point of the second subset specifies wind traveling out of the first cell parallel to the first direction;

the processor setting an input wind speed of the first cell in the first direction equal to a highest-magnitude wind speed specified by any wind vector measured at a measurement point of the first subset;

the processor choosing an output wind speed of the first cell in the first direction equal to a highest-magnitude wind speed specified by any wind vector measured at a measurement point of the second subset; and the processor repeating the identifying, the setting, and the choosing for each of the remaining three directions of the group of horizontal wind directions;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

9. The method of claim 8, where measurement points comprised by the first layer of the horizontal layers correspond to a first set of measured wind vectors, where all values of the first set of measured wind vectors are similar, and where no value of the first set of measured wind vectors is similar to a value of a wind vector associated with a measurement point comprised by a different layer of the horizontal layers.

10. The method of claim 8, where boundaries of each cell are chosen such that each cell encloses cross-sections of an entire cluster of buildings and encloses cross-sections of no other buildings, and where buildings are organized into clusters by application of a DBSCAN (density-based spatial clustering of applications with noise) algorithm to the buildings located within the volume of space.

11. The method of claim 8, where the employing further comprises:

the processor inferring a set of association rules that each specify that winds entering the first cell from a triggering input-wind direction must exit the first cell from an associated output-wind direction, where the triggering input-wind direction and the associated output-wind direction are both selected from the group of horizontal wind directions;

the processor incorporating the association rules into the wind-propagation model;

the processor building a layer-ventilation model of the first layer as functions of the wind-speed decay rates, inferred relationships, and inferred association rules of each cell of the first layer, where the layer-ventilation model comprises rules for determining wind vectors of winds traveling out of the first layer as a function of values of wind vectors of winds traveling into the layer;

the processor aggregating the layer-ventilation models of all horizontal layers of the volume into a regional ventilation model; and the processor incorporating the regional model into the wind-propagation model of the volume of space.

12. The method of claim 8, further comprising providing at least one support service for at least one of creating, integrating, hosting, maintaining, and deploying computer-readable program code in the computer system, wherein the computer-readable program code in combination with the computer system is configured to implement the receiving, the stratifying, the retrieving, the dividing, the selecting, the inferring, and the forwarding.

13. A computer program product, comprising a computer-readable hardware storage device having a computer-readable program code stored therein, the program code configured to be executed by a building-information management system comprising a processor, a memory coupled to the processor, and a computer-readable hardware storage device coupled to the processor, the storage device containing program code configured to be run by the processor via the memory to implement a method for a building-information management system with directional wind propagation and diffusion, the method comprising:

the processor receiving a set of wind vectors that have been measured concurrently at a set of measurement points located within a volume of air, where each wind vector of the set of wind vectors specifies a value of a horizontal wind speed at a corresponding measurement point of the set of measurement points and a value of a horizontal wind direction at the corresponding measurement point;

the processor stratifying the volume of air into a vertical stack of contiguous, non-overlapping horizontal layers, where each layer of the stack extends through a contiguous range of vertical heights and encompasses a subset of the set of measurement points measured at heights within that layer's range of vertical heights;

the processor retrieving a set of building attributes that identify locations and physical dimensions of buildings located within the volume of space;

the processor dividing each layer of the horizontal layers into a horizontal grid of rectangular cells, where a first cell of a first layer of the horizontal layers encloses horizontal cross-sections of a first subset of the buildings at heights within the first layer's range of vertical heights;

the processor selecting, as a function of those received wind vectors that were measured at measurement points comprised by the first cell, an input wind speed of the first cell in each horizontal wind direction and an output wind speed of the first cell in each horizontal wind direction, where each horizontal wind direction is selected from the group consisting of northerly, southerly, easterly, and westerly, and where the selecting an input wind speed of the first cell in each horizontal wind direction and an output wind speed of the first cell in each horizontal wind direction further comprises:

the processor identifying a first subset of the set of measurement points and a second subset of the set of measurement points, where the first subset and the second subset both consist of measurement points located along boundaries of the first cell, where each wind vector measured at a measurement point of the first subset specifies wind traveling into the first cell parallel to a first direction of the group of horizontal wind directions, and where each wind vector measured at a measurement point of the second subset specifies wind traveling out of the first cell parallel to the first direction;

the processor setting an input wind speed of the first cell in the first direction equal to a highest-magnitude wind speed specified by any wind vector measured at a measurement point of the first subset;

the processor choosing an output wind speed of the first cell in the first direction equal to a highest-magnitude wind speed specified by any wind vector measured at a measurement point of the second subset; and the processor repeating the identifying, the setting, and the choosing for each of the remaining three directions of the group of horizontal wind directions;

the processor inferring relationships between wind-speed decay rates of horizontal winds flowing through the first cell and retrieved attributes of buildings that are at least partially enclosed by the first cell; and the processor forwarding to downstream modules of the building-information management system a wind-propagation model of the volume of space that identifies, as a function of the inferred relationships, rules for determining wind vectors of winds exiting the volume as functions of wind vectors of winds entering the volume.

14. The computer program product of claim 13, where measurement points comprised by the first layer of the horizontal layers correspond to a first set of measured wind vectors, where all values of the first set of measured wind vectors are similar, and where no value of the first set of measured wind vectors is similar to a value of a wind vector associated with a measurement point comprised by a different layer of the horizontal layers.

15. The computer program product of claim 13, where boundaries of each cell are chosen such that each cell encloses cross-sections of an entire cluster of buildings and encloses cross-sections of no other buildings, and where buildings are organized into clusters by application of a DBSCAN (density-based spatial clustering of applications with noise) algorithm to the buildings located within the volume of space.

16. The computer program product of claim 13, where the employing further comprises:

the processor inferring a set of association rules that each specify that winds entering the first cell from a triggering input-wind direction must exit the first cell from an associated output-wind direction, where the triggering input-wind direction and the associated output-wind direction are both selected from the group of horizontal wind directions; and the processor incorporating the association rules into the wind-propagation model.

17. The computer program product of claim 16, further comprising:

the processor building a layer-ventilation model of the first layer as functions of the wind-speed decay rates, inferred relationships, and inferred association rules of each cell of the first layer, where the layer-ventilation model comprises rules for determining wind vectors of winds traveling out of the first layer as a function of values of wind vectors of winds traveling into the layer;

the processor aggregating the layer-ventilation models of all horizontal layers of the volume into a regional ventilation model; and the processor incorporating the regional model into the wind-propagation model of the volume of space.

* * * * *